US006665766B1

United States Patent
Guccione et al.

(10) Patent No.: US 6,665,766 B1
(45) Date of Patent: Dec. 16, 2003

(54) ADAPTABLE CONFIGURATION INTERFACE FOR A PROGRAMMABLE LOGIC DEVICE

(75) Inventors: Steven A. Guccione, Austin, TX (US); Prasanna Sundararajan, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 540 days.

(21) Appl. No.: 09/639,513

(22) Filed: Aug. 14, 2000

(51) Int. Cl.[7] .............................................. G06F 13/14
(52) U.S. Cl. ...................................... 710/305; 710/104
(58) Field of Search .......................... 710/100, 305–315, 710/104, 10; 716/16, 17; 365/201, 182; 713/1–100

(56) References Cited

U.S. PATENT DOCUMENTS

| 5,105,388 A | * | 4/1992 | Itano et al. ............. 365/185.22 |
| 5,600,597 A | * | 2/1997 | Kean et al. ............. 365/189.08 |
| 5,652,904 A | * | 7/1997 | Trimberger ................... 712/38 |
| 5,737,235 A | * | 4/1998 | Kean et al. .................... 716/16 |
| 5,892,961 A | * | 4/1999 | Trimberger ................... 712/10 |
| 5,944,813 A | * | 8/1999 | Trimberger ................... 712/36 |
| 5,970,005 A | * | 10/1999 | Yin et al. .................... 365/201 |
| 5,994,892 A | * | 11/1999 | Turino et al. ................ 324/142 |
| 6,026,481 A | | 2/2000 | New et al. |
| 6,077,315 A | * | 6/2000 | Greenbaum et al. ........ 717/157 |
| 6,102,963 A | * | 8/2000 | Agrawal ....................... 716/17 |
| 6,130,842 A | * | 10/2000 | Lacey et al. ............ 365/185.24 |
| 6,198,304 B1 | * | 3/2001 | Sasaki ........................... 326/39 |
| 6,216,191 B1 | * | 4/2001 | Britton et al. ............... 710/305 |
| 6,356,109 B1 | * | 3/2002 | Furuta et al. .................. 326/41 |
| 6,363,517 B1 | * | 3/2002 | Levi et al. ...................... 716/6 |
| 6,460,131 B1 | * | 10/2002 | Trimberger ................... 712/39 |
| 6,510,546 B1 | * | 1/2003 | Blodget ........................ 716/16 |

OTHER PUBLICATIONS

Xilinx, Inc., "The Programmable Logic Data Book," 1999, available from Xilinx, Inc., 2100 Logic Drive, San Jose, California 95124, pp. 3–14 through 3–23.

* cited by examiner

Primary Examiner—Paul R. Myers
(74) Attorney, Agent, or Firm—LeRoy D. Maunu (57) ABSTRACT

An adaptable configuration interface for a programmable logic device (PLD). A PLD includes a plurality of configuration pins and circuitry implementing read and write protocols for reading data from and writing configuration data to the PLD. A register that is external to the PLD is connected to the configuration pins of the PLD, and a processor is coupled to the register. A first set of routines, each executable on the processor, are configured to read and write values from and to the register. A second set of routines, each executable on the processor, provide an application programming interface for the configuration and readback of data from the PLD via the first set of routines. The layered structure of the interface routines aids in incrementally changing from a software controlled configuration interface to an interface that is a combination of hardware and software.

12 Claims, 5 Drawing Sheets

ADAPTABLE CONFIGURATION INTERFACE FOR A PROGRAMMABLE LOGIC DEVICE

GOVERNMENT CONTRACT

The U.S. Government has a paid-up license in this invention and the right in limited circumstances to require the patent owner to license others on reasonable terms as provided for by the terms of DABT63-99-3-0004 awarded by DARPA.

FIELD OF THE INVENTION

The present invention generally relates to the configuration of programmable logic devices, and more particularly to interfaces for configuring programmable logic devices.

BACKGROUND

In the past, configuring a programmable logic device (PLD) such as a field programmable gate array (FPGA) was relatively simple. The configuration data in the form of a configuration bitstream was stored in a some form of serial, non-volatile memory. The bitstream was then loaded into the FPGA with minimal hardware and software support. This approach continues to the present. However, the vast increase in the number of gates and the increased functionality of PLDs has made the simple configuration method very time consuming.

New configuration interfaces, for example, the SelectMap interface for the Xilinx Virtex™ FPGA, are made to exploit new configuration capabilities of FPGAs and to reduce the time required to configure a device with a configuration bitstream. For example, the SelectMap interface supports partial reconfiguration, readback, partial readback and control functions such as reset. The SelectMap interface includes an eight-bit parallel port that significantly increases the configuration bandwidth over prior PLDs. Further details on the configuration of Xilinx FPGAs can be found on pages 3-14 to 3-23 of The Programmable Logic Databook 1999, which is available from Xilinx, Inc., and which pages are incorporated herein by reference.

Despite the new features and reduced configuration times, designers are often reluctant to use a new interface in view of the time required to learn the new interface and tight development schedules. For example, the SelectMap configuration/readback features require more complex hardware interfaces and additional software to make use of the features, compared to previous configuration interfaces. Thus, designers sometimes continue to use the old interface in order to save development time.

An interface arrangement and method that address the aforementioned problems, as well as other related problems, are therefore desirable.

SUMMARY OF THE INVENTION

An adaptable configuration interface for a programmable logic device (PLD) is provided in various embodiments of the invention. A PLD includes a plurality of configuration pins and circuitry implementing read and write protocols for reading data from and writing configuration data to the PLD. An interface register that is external to the PLD is connected to the configuration pins of the PLD, and a processor is coupled to the register. The flip-flops of the register correspond to the configuration pins of the PLD, whereby programs executing on the processor can interact with the PLD during the configuration and readback of data. A first set of routines, each executable on the processor, are configured to read and write values from and to the register. A second set of routines, each executable on the processor, provide an application programming interface for configuration and reading back data from the PLD via the first set of routines. The layered structure of the software components of the interface arrangement supports incrementally adapting the PLD interface arrangement from more software control to a combination of less software and more hardware control. Thus, as a design nears completion, the configuration performance can be enhanced by implementing more of the interface arrangement in hardware. It will be appreciated that various other embodiments are set forth in the Detailed Description and Claims, which follow.

BRIEF DESCRIPTION OF THE DRAWINGS

Various aspects and advantages of the invention will become apparent upon review of the following detailed description and upon reference to the drawings, in which.

DETAILED DESCRIPTION

Various example embodiments of the present invention are described in terms of the SelectMap configuration mode for the Virtex FPGA from Xilinx. Those skilled in the art will appreciate, however, that the invention is not limited to a particular configuration protocol nor to a particular type of PLD.

The interface of the present invention allows a designer to configure a PLD using high-level API routines. The API routines are designed to perform configuration operations on the PLD in accordance with a selected configuration mode. Details concerning the particular protocol for the selected configuration mode are hidden from the user, thereby making the interface easy to use.

The API of the present invention is structured in a layered fashion, which is advantageous in a number of respects. The layered API permits the designer to tailor the routines of the lower layer to interact with the PLD in the particular hardware environment in which the PLD is deployed. In addition, performance of the API can be improved in increments as the system design stabilizes by selectively changing the implementation of the PLD configuration control signals from the API software to hardware control.

Figure 1:
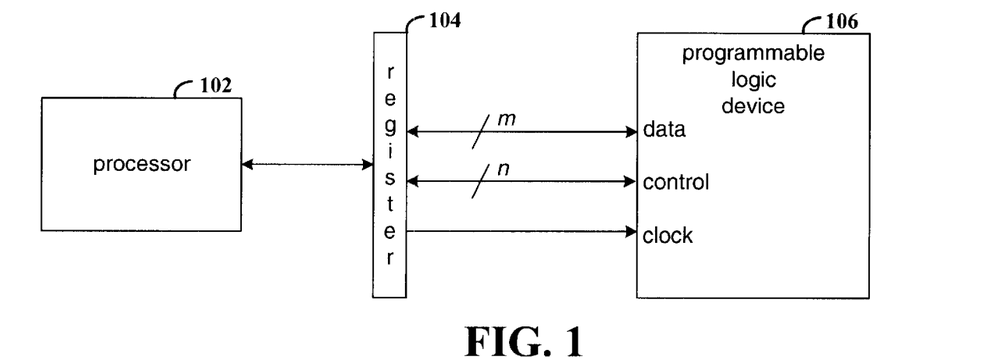
FIG. 1 is a functional block diagram of an interface arrangement in accordance with one embodiment of the invention.

FIG. 1 is a functional block diagram of an interface arrangement in accordance with one embodiment of the invention. Interface arrangement 100 includes processor 102 and interface register 104, which is external to PLD 106 and connected to the configuration pins of the PLD. Configuration interface software (not shown), which is executable on processor 102, writes values to register 104 in response to calls from a configuration program (not shown). The value written to the register represents the configuration data to download to PLD 106 and the states of control and clock signals to be applied to the PLD. The interface software also supports both writing configuration data to and reading back data from PLD 106 via interface register 104.

The characteristics of processor 102 depend on the system in which PLD 106 is deployed. Thus, processor 102 may have characteristics ranging from those of an embedded micro-controller to a general purpose computer instruction processor. The characteristics of the system also determine how processor 102 is coupled to register 104, for example, via a bus or a direct connection.

Register 104 is conventional and has parallel output ports for connecting to the configuration pins of PLD 106. The storage elements of register 104 that are used for writing data to and reading back data from the PLD have input ports coupled to processor 102 and also connected to the control and data pins of the PLD. The logic levels of the bits stored in register 104 drive the data, control, and clock pins of PLD 106 or are driven by the PLD.

Figure 2:
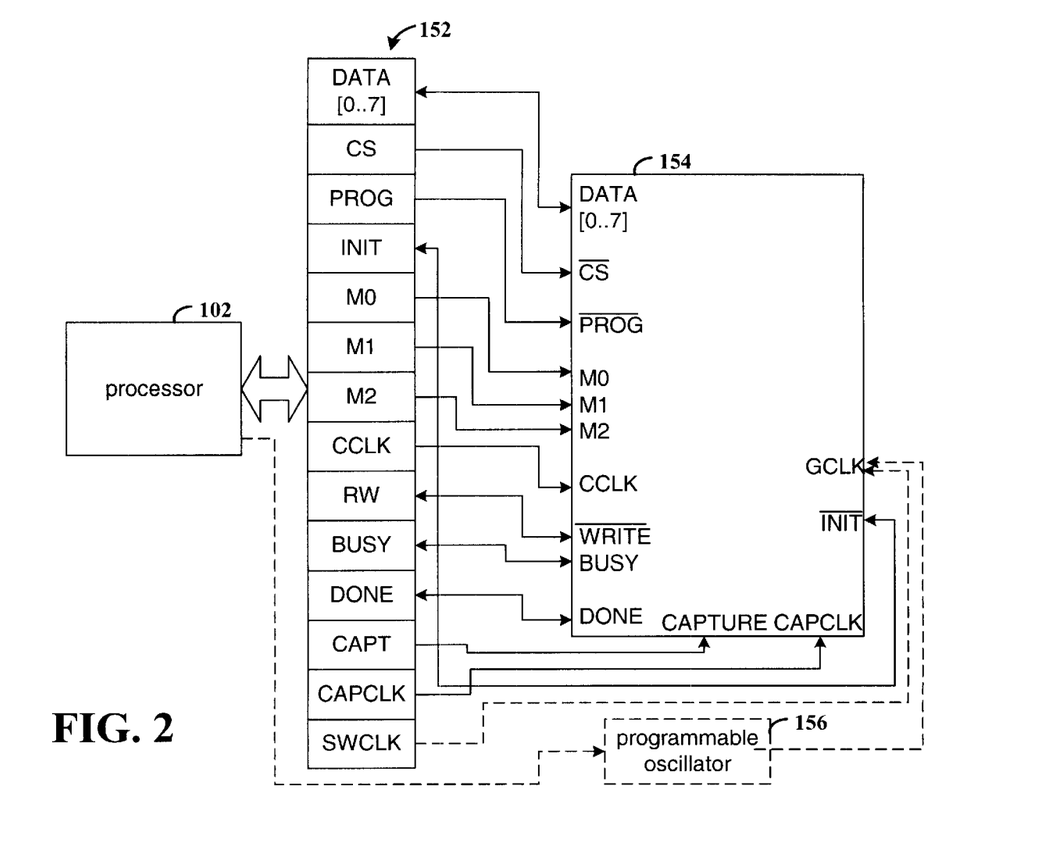
FIG. 2 is a functional block diagram of an example interface arrangement in accordance with the Xilinx Virtex FPGA.

FIG. 2 is a functional block diagram of an interface arrangement in accordance with another embodiment of the invention. This interface arrangement illustrates a specific PLD, for example, a Virtex FPGA from Xilinx. Register 152 includes storage elements for each of the configuration pins of PLD 154, and each storage element is connected to a corresponding one of the configuration pins. The bits of register 152 are described in Table 1 below. The "Direction" is defined relative to the interface register. That is, "in" indicates that PLD 154 writes to interface register 152, and "out" indicates that interface register 152 writes to the PLD.

TABLE 1

| Name | Direction | Description |
| --- | --- | --- |
| DATA | in/out | Data written during configuration and read during readback. |
| CS | out | Chip Select signal enables the FPGA to read or write data. To read or write data, CS must be asserted low. |
| PROG | out | Asynchronous reset to configuration logic. |
| INIT | in/out | Indicates initialization progress and configuration error, if any. |
| M0 | out | Mode bits 0, 1, and 2 select the configuration mode of the FPGA. |
| M1 | out | Mode bit 1. |
| M2 | out | Mode bit 2. |
| CCLK | out | Configuration clock that synchronizes the loading and reading of the data during configuration and readback. |
| RW | out | SelectMap Read/Write signal. When asserted low, the RW signal indicates data being written to the FPGA. When asserted high, RW indicates data is being output by the FPGA. |
| BUSY | in | SelectMap port busy signal. When CS is asserted, BUSY output indicates when the Virtex device can accept another byte. If BUSY is low the Virtex device reads data on the next rising CCLK edge that both CS and RW are asserted low. If BUSY is high, the current byte is ignored and must be reloaded during the next CCLK rising edge when BUSY is low. When CS is not asserted, BUSY is tri-stated and asserted high. |

TABLE 1-continued

| Name | Direction | Description |
| --- | --- | --- |
| DONE | in | Configuration complete signal. |
| CAPT | out | State capture enable for saving flip-flop states in configuration memory prior to readback. |
| CAPCLK | out | State capture clock used in combination with the CAPT signal. |
| SWCLK | out | Software control to perform clock stepping. This bit should be tied to any one of the global clock buffers on the Virtex chip. |

Some interface arrangements include a programmable oscillator 156. The programmable oscillator is coupled to the processor and to the global clock pin (GCLK) of the FPGA and is used for stepping the global clock under processor control. For systems without a programmable oscillator, the SWCLK bit in interface register 152 can be connected to the GCLK pin.

Figure 3:
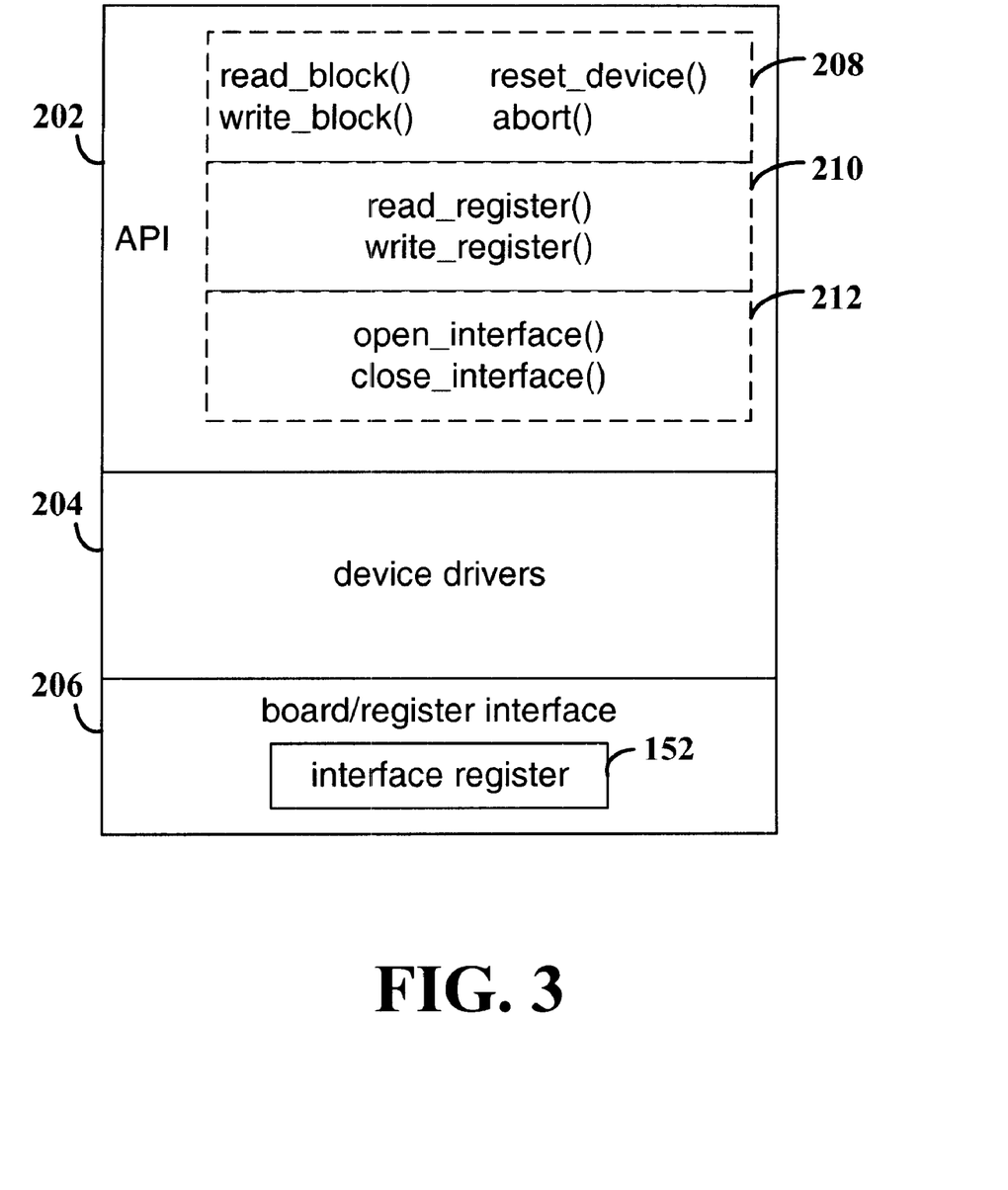
FIG. 3 is a block diagram that shows the relationship between the application programming interface, device drivers, and interface register.

FIG. 3 is a block diagram that shows the relationship between the application programming interface, device drivers, and interface register. The interface for configuring a PLD includes an application programming interface (API) 202 at the highest level, device drivers 204 for providing an interface between the API and interface register 152, and board/register interface 206. The implementation characteristics of device drivers 204 and board/register interface 206 depend on the system in which the PLD is used.

API 202 is constructed such that few or no software modifications are required by the designer in order to interact with the configuration pins of the FPGA. The routines provided by the interface provide basic configuration functionality which is easy to learn and applicable across different types of PLDs. API 202 also handles the configuration protocol with the PLD, thereby hiding the intricacies of configuration from the designer.

In one embodiment, API 202 is layered and written in the C language, which permits incremental changes from an initial software-controlled configuration arrangement to a combined software/hardware-controlled arrangement. (In other embodiments, other software languages are used to implement the API.) In addition, the API is portable across processor platforms. Top layer 208 includes the read_block( ), write_block( ), reset_device( ), and abort( ) routines. Middle layer 210 includes the read_register( ) and write_register( ) routines, and bottom layer 212 includes the open_interface( ) and close_interface( ) routines.

The routines of top layer 208 include routines to access configuration data and configuration control routines. For example, in the Selectmap configuration mode, blocks of configuration data can be written to or read from an FPGA. Example implementations of the routines in top layer 208 are described below.

The read_block( ) routine reads a block of data from the data port of the FPGA in the SelectMap configuration mode. The read_register( ) routine of middle layer 210 is called one or more times to read configuration data from interface register 152, which receives data from the FPGA. The program interface to the read_block( ) routine may be defined as:

int read_block (unsigned char data[ ], int byteCount)

If the read_block routine is successful, a zero value is returned, otherwise a negative number is returned that indicates the byte on which the read failed. The data read from the FPGA is returned in the data array, and the byteCount parameter is the number of bytes to read from the FPGA.

The write_block( ) routine writes a block of configuration data to the FPGA in the SelectMap configuration mode. The write_register( ) routine of middle layer 210 is called one or more times to write the configuration data to interface register 152, which drives the data and control pins of the FPGA. The program interface to the write_block( ) routine may be defined as:

int write_block (unsigned char data[ ], int byteCount)

If the write_block routine is successful, a zero value is returned, otherwise a negative number is returned that indicates the byte number on which the write failed. The data to be written to the FPGA is passed in the data array, and the byteCount parameter is the number of bytes to write to the FPGA.

The reset_device( ) routine resets the FPGA. A zero value is returned if the reset was successful. Otherwise, a negative value is returned. The program interface for the reset_device( ) routine may be defined as:

int reset_device( )

The abort( ) routine is used for re-synchronizing the data bus (not shown) that is internal to the FPGA. For example, the Virtex FPGA reads configuration data in even multiples of 4 bytes. If the requested number of bytes is not an even multiple of 4, there will remain configuration data on the bus after the read_block operation has completed. The abort( ) routine is used to clear the FPGA data bus. In accordance with the protocol defined by the Virtex FPGA, the abort operation involves the manipulation of the CS and RW signals. The abort( ) routine may also be used when alternating between reads and writes to ensure that the data pins of the FPGA are maintained in the proper state. A zero value is returned if the abort was successful. Otherwise, a negative value is returned. The program interface for the abort( ) routine may be defined as:

int abort( )

The routines of middle layer 210 can be used to read and write values from and to interface register 152. Where the routines execute in a simple embedded system, the read_register( ) and write_register( ) routines read and write the memory or I/O location that is mapped to interface register 152. In systems having operating system support, the read_register( ) and write_register( ) routines call system-defined device drivers 204 for access to the interface register. The particular code to implement the read_register and write_register routines depends on the particular hardware/software environment in which the interface register is implemented.

The read_register( ) routine reads the contents of interface register 152. The program interface for the read_register( ) routine may be defined as:

int read_register( )

The value returned represents the contents of the interface register.

The write_register( ) routine writes a value to interface register 152. The program interface for the write_register( ) routine may be defined as:

void write_register(int value)

The value passed as a parameter is the data to be written to the interface register.

The particular implementation of the read_register and write_register routines depends on the system in which the interface register is used. For example, the processing of the routines may vary in accordance with whether operating system support is available.

Bottom layer 212 of API 202 includes the open_interface( ) and close_interface( ) routines. The open_interface( ) routine may be used before beginning to read or write data from or to the FPGA. The open_interface( ) routine establishes communications with a device driver and performs any necessary initializations.

The close_interface( ) routine may be used after all reading and writing is complete. The routine performs tasks such as memory de-allocation depending on the implementation.

The layered API and register interface allow the PLD to be configured with minimal hardware and software design effort. However, the software driven configuration control signals may make configuration undesirably slow. The layered API allows for easy adaptation to move from software-driven to hardware-driven control signals in order to improve configuration performance. For example, selected ones of the configuration control bits in interface register 152 can be replaced with a hardware implementation, and the software that writes the bits can be easily modified to accommodate the hardware implementation. Thus, a system can be quickly developed and implemented, and once the design has stabilized the configuration arrangement can be adapted to improve configuration performance.

Figure 4:
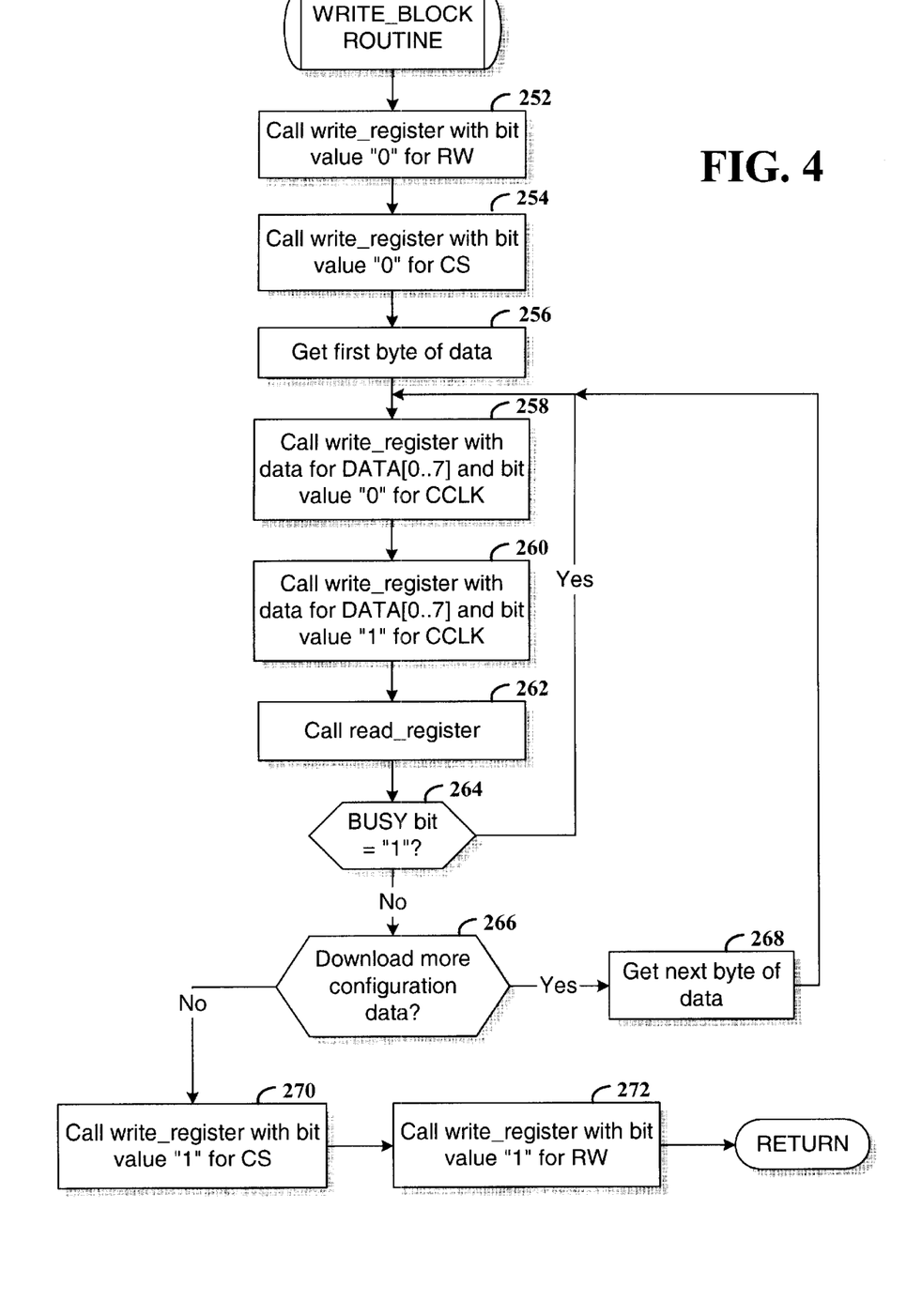
FIG. 4 is a flowchart of a process that implements the functionality of the write_block routine for a Virtex FPGA.

FIG. 4 is a flowchart of a process that implements the functionality of the write_block routine for a Virtex FPGA. The write_block routine, along with the subsequently described read_block, reset_device, and abort routines, are implemented for interacting with a Xilinx Virtex FPGA in the SelectMap configuration mode. It will be appreciated that comparable routines could be developed for other PLDs and different configuration modes. The write_block routine generally writes a block of input data to the configuration data pins of the FPGA.

At step 252, the write_register routine is called to write the bit value "0" to the RW bit of the interface register. The bit value "0" is written to the CS bit at step 254. In response to the bit values, the FPGA is placed in a write mode.

At step 256, the first byte of configuration data is retrieved. In the example embodiment, the configuration data is passed to the write_block routine in a character array. The write_register routine is called at step 258 with bit value "0" for the CCLK of the interface register and the byte of data for the DATA[0 . . . 7] locations of the interface register. At step 260, the CCLK bit is set to bit value "1" and the data bits are driven to the FPGA.

At step 262, the read_register is called to read the contents of the interface register. If the BUSY bit has a bit value "1", control is returned to steps 258 and 260 where the CCLK bit is toggled while the same data byte is maintained in the interface register. When the FPGA clears the BUSY bit in the interface register, control is directed to step 266.

Decision step 266 tests whether there is more configuration data to download. In the example embodiment, the number of bytes of configuration data is passed as a parameter to the write_block routine. If there are more bytes of data to download, step 268 gets the next byte and control is directed to step 258. Otherwise, control is directed to step 270.

At step 270, the write_register routine is called to write the bit value "1", to the CS location of the interface register to de-select the FPGA. The bit value "1" is written to the RW bit of the interface register at step 272 complete the write_block routine. Control is then returned to the calling program.

Figure 5:
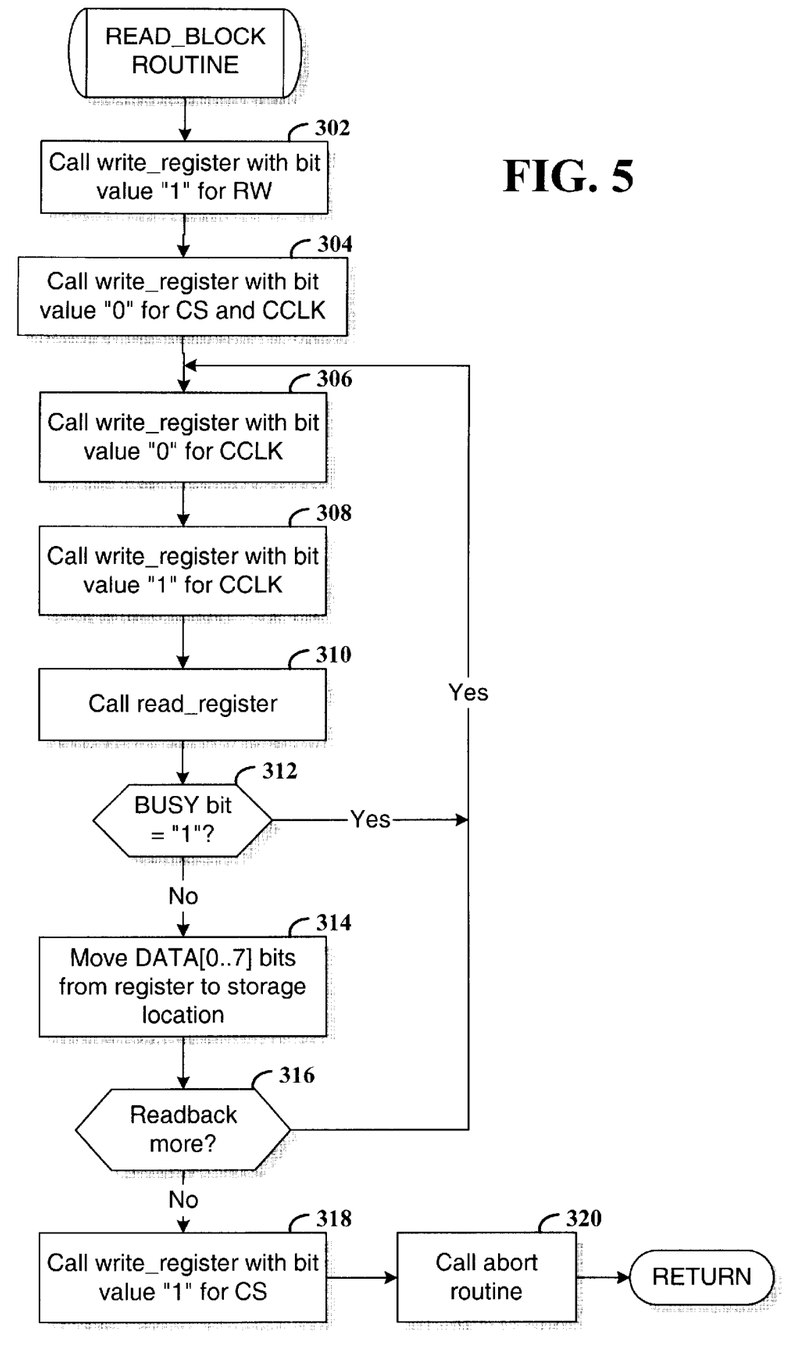
FIG. 5 is a flowchart of a process that implements the functionality of the read_block routine for a Virtex FPGA.

FIG. 5 is a flowchart of a process that implements the functionality of the read_block routine for a Virtex FPGA.

The read_block routine generally reads bytes of data from the configuration data port of the FPGA. In one embodiment, the number of bytes to read and a character array for storing the readback data are passed as parameters to the read_block routine.

At step 302, the write_register routine is called with bit value "1" for the RW location of the interface register. At step 304, the write_register routine is called again with bit values "0" for the CS and CCLK locations. In response, the FPGA is placed in a read mode.

At step 306, the write_register routine is called with bit value "0" for the CCLK location, and at step 308, the write_register routine is called with bit value "1" for CCLK. In response to stepping the CCLK signal, the FPGA outputs data on the configuration data pins, which are written to the DATA[0 . . . 7] locations of the interface register.

The read_register routine is called at step 310 to read the value in the interface register. If the BUSY bit of the value read from the interface register has a bit value "1" (indicating that the FPGA did not write valid data to the data pins), then control is returned to step 306 to step the clock and again read the interface register. Steps 306–312 are repeated until the FPGA provides valid readback data.

At step 314, the byte of readback data from the interface register is moved to an application-dependent storage location (e.g., computer memory or disk storage). After reading the byte of readback data from the FPGA, if there is still more data to read (controlled by the input parameter), then control is returned to step 306 to begin reading the next byte of data.

Once all the requested data has been read, a bit value "1" is written to the CS bit of the interface register to de-select the device. At step 320, the abort routine is called to complete the read sequence.

Figure 6:
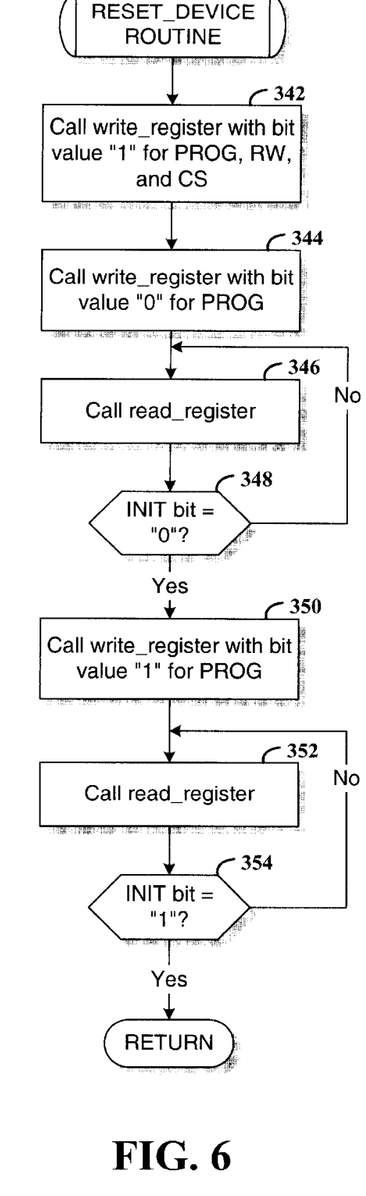
FIG. 6 is a flowchart of a process that implements the reset_device routine for a Virtex FPGA.

FIG. 6 is a flowchart of a process that implements the reset_device routine for a Virtex FPGA. The reset_device( ) routine generally resets the FPGA. At step 342, the write_register routine is called to write the bit value "1" to the PROG, RW, and CS bits of the interface register. CS is used primarily for reading and writing data. By holding CS high, the configuration memory can be cleared.

At step 344, the bit value "0" is written to the PROG bit of the interface register to signal to the FPGA to reset the configuration logic. The value in the interface register is read at step 346, and if the INIT bit is not "0", control is returned to step 346. When the FPGA has reset the configuration logic, a bit value "1" is driven on the ~INIT pin of the FPGA.

At step 350, the PROG bit of the interface register is set to bit value "1", and the value of the interface register is read at step 352. Decision step 354 returns control to step 352 until the FPGA outputs a bit value "1" to the INIT bit of the interface register. Once the INIT bit is "1", control is returned to the calling program.

Figure 7:
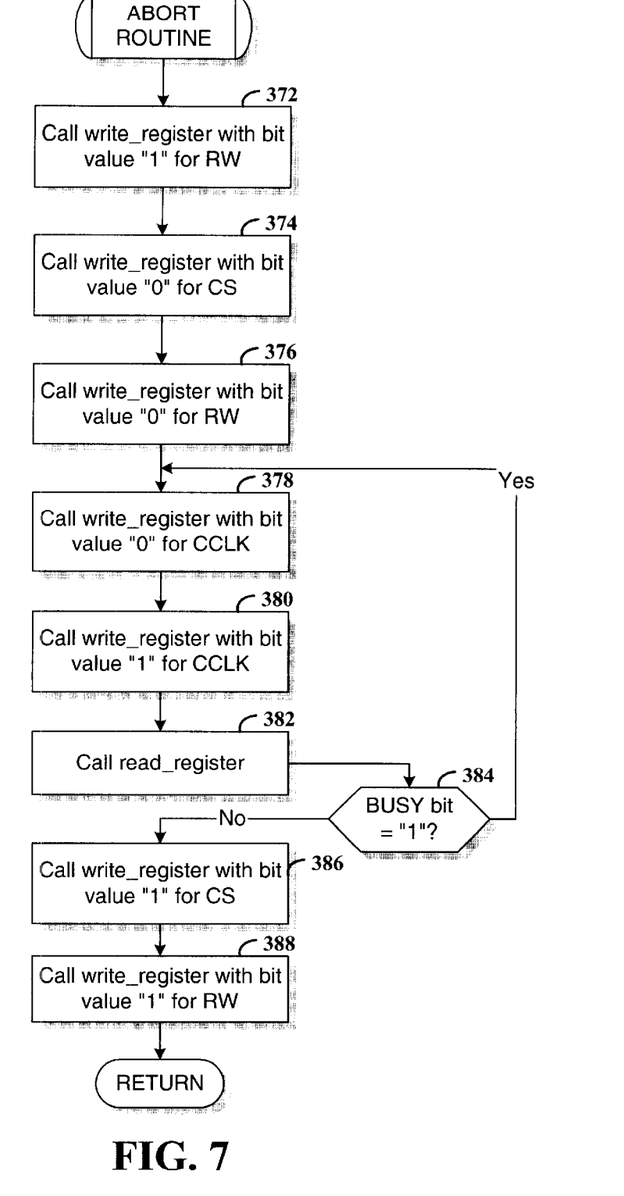
FIG. 7 is a flowchart of a process that implements the abort routine for a Virtex FPGA.

FIG. 7 is a flowchart of a process that implements the abort routine for a Virtex FPGA. The abort( ) routine is generally used after reading back configuration data from the FPGA. At step 372, the bit value "1" is written to the RW bit of the interface register, and at step 374 the bit value "0" is written to the CS bit. In response, the FPGA is placed in a readback mode. At step 376, the bit value "0" is written to the RW bit of the interface register, which places the FPGA in a write mode. Switching the state of the RW signal when the CS bit is asserted causes an abort sequence in the FPGA.

The CCLK bit of the interface register is first written with the bit value "0" at step 378 and then written with the bit value "1" at step 380. At step 382, the contents of the interface register are read, and if the BUSY bit is "1" decision step 384 returns control to step 378. Otherwise, control is directed to step 386.

At step 386, the CS bit is written with the bit value "1" to de-select the FPGA. The RW bit of the interface register is set to "1" at step 388, and control is then returned to the calling program.

The layered structure of the software components of the interface arrangement supports incremental adaptation of the interface from an interface having more software control to an interface having a combination of less software and more hardware control. Thus, as a design nears completion, the configuration performance can be enhanced by implementing more of the interface arrangement in hardware. For example, a first incremental change might be to implement the application CCLK signal in hardware instead of in the software routines as described above. This change would improve performance by replacing the slower software application of CCLK with a faster hardware generated CCLK signal. In another example, the code that implements the read_block and write_block routines could be changed to implement a direct memory access (DMA) arrangement. This alteration permits the application that references the read_block and write_block routines to remain unchanged while providing a path for performance improvement of the configuration interface.

While the invention has been described with reference to the configuration interface for a specific FPGA (Virtex FPGA) in a particular configuration mode (SelectMap), those skilled in the art will recognize that the described embodiments could be adapted and the invention applied to different PLDs having different configuration modes. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A configuration interface arrangement for a programmable logic device (PLD) having a plurality of configuration pins, the configuration pins including one or more input/output data pins, a plurality of configuration control pins including a read/write control pin, and a configuration clock pin, the PLD having circuitry implementing read and write protocols for reading data from and writing configuration data to the PLD, the configuration interface arrangement comprising:

a register external to the PLD and including a plurality of memory elements respectively connected to the configuration pins of the PLD;

a processor coupled to the register;

a first set of routines executable on the processor and configured to read and write bit values from and to the register; and a second set of routines executable on the processor, a first one of the second set of routines configured to write data to the PLD via calls to the first set of routines in response to a routine call from a program executing on the processor, and further configured to automatically write bit values to the memory elements connected to the configuration pins as required by the write protocol.

2. The configuration interface arrangement of claim 1, wherein the second set of routines further includes a second routine configured to read data from the PLD via the first set of routines in response to a routine call from a program executing on the processor, and further configured to automatically write bit values to the memory elements connected to the configuration pins as required by the read protocol.

3. The configuration interface arrangement of claim 2, wherein the first routine of the second set is configured to write a selectable quantity of configuration data to the PLD responsive to an input parameter.

4. The configuration interface arrangement of claim 3, wherein the second routine of the second set is configured to read a selectable quantity of data from the PLD responsive to an input parameter.

5. The configuration interface arrangement of claim 1, wherein the PLD includes circuitry implementing a protocol to reset the PLD, and the second set of routines further comprises a third routine configured to reset the PLD via the first set of routines in response to a routine call from a program executing on the processor, and further configured to automatically write bit values to the memory elements connected to the configuration pins as required by the reset protocol.

6. The configuration interface arrangement of claim 2, wherein the first set of routines are adaptable for system-specific characteristics of the register, and the second set of routines are portable between processors.

7. The configuration interface arrangement of claim 6, wherein the first routine of the second set is configured to write a selectable quantity of configuration data to the PLD responsive to an input parameter.

8. The configuration interface arrangement of claim 7, wherein the second routine of the second set is configured to read a selectable quantity of data from the PLD responsive to an input parameter.

9. The configuration interface arrangement of claim 6, wherein the PLD includes circuitry implementing a protocol to reset the PLD, and the second set of routines further comprises a third routine configured to reset the PLD via the first set of routines in response to a routine call from a program executing on the processor, and further configured to automatically write bit values to the memory elements connected to the configuration pins as required by the reset protocol.

10. A method for selectably configuring and reading back data from a programmable logic device (PLD) having a plurality of configuration pins, the configuration pins including one or more input/output data pins, a plurality of configuration control pins including a read/write control pin, and a configuration clock pin, the PLD having circuitry implementing read and write protocols for reading data from and writing configuration data to the PLD, comprising:

connecting respective memory elements of a register external to the PLD to the configuration pins of the PLD;

providing a first set of routines executable on a processor, the first set of routines configured to read and write bit values from and to the register responsive to routine calls;

providing a second set of routines executable on the processor, a first one of the second set of routines configured to write data to the PLD via calls to the first set of routines in response to a routine call from a program executing on the processor, and further configured to automatically write bit values to the memory elements connected to the configuration pins as required by the write protocol, and a second one of the second set of routines configured to read data from the PLD via the first set of routines in response to a routine call from a program executing on the processor, and further configured to automatically write bit values to the memory elements connected to the configuration pins as required by the read protocol;

configuring the PLD via a routine call to the first routine; and reading back data from the PLD via a routine call to the second routine.

11. The method of claim 10, wherein the first routine of the second set is configured to write a selectable quantity of configuration data to the PLD responsive to an input parameter.

12. The method of claim 11, wherein the second routine of the second set is configured to read a selectable quantity of data from the PLD responsive to an input parameter.

* * * * *